United States Patent
Freire Rosales et al.

(10) Patent No.: US 9,360,535 B2
(45) Date of Patent: Jun. 7, 2016

(54) ISOTROPIC SENSOR FOR MAGNETIC AND ELECTRIC FIELDS

(71) Applicant: WAVECONTROL, S.L., Barcelona (ES)

(72) Inventors: Manuel José Freire Rosales, Seville (ES); Joaquín Bernal Méndez, Seville (ES); Carlos Alonso Castro, Barcelona (ES); Laurent Derousseau, Barcelona (ES)

(73) Assignee: WAVECONTROL, S.L., Barcelona (ES)

( * ) Notice: Subject to any disclaimer, the term of this patent is extended or adjusted under 35 U.S.C. 154(b) by 0 days.

(21) Appl. No.: 14/414,625

(22) PCT Filed: Jul. 1, 2013

(86) PCT No.: PCT/ES2013/070446
§ 371 (c)(1),
(2) Date: Jan. 13, 2015

(87) PCT Pub. No.: WO2014/013113
PCT Pub. Date: Jan. 23, 2014

(65) Prior Publication Data
US 2015/0168505 A1   Jun. 18, 2015

(30) Foreign Application Priority Data

Jul. 19, 2012   (ES) .................................. 201231149

(51) Int. Cl.
*G01R 33/06* (2006.01)
*G01R 29/12* (2006.01)
*G01R 33/02* (2006.01)
*G01R 29/08* (2006.01)

(52) U.S. Cl.
CPC ................ *G01R 33/06* (2013.01); *G01R 29/08* (2013.01); *G01R 29/0878* (2013.01); *G01R 29/12* (2013.01); *G01R 33/02* (2013.01)

(58) Field of Classification Search
None
See application file for complete search history.

(56) References Cited

U.S. PATENT DOCUMENTS 3,559,046 A * 1/1971 Robinson ............... G01V 3/082
                                                      324/330
4,023,093 A * 5/1977 Aslan .................... G01R 33/028
                                                      324/247

(Continued)

OTHER PUBLICATIONS

Maldonado, J. Botella, "International Search Report," prepared for PCT/ES2013/070446, as mailed Nov. 25, 2013, three pages.
David, V. et al; "An Isotropic Sensor for the Measurement of Low Frequency Electric and Magnetic Fields"; 2002 Conference on Precision Electromagnetic Measurements (CPEM 2002), Ottawa, Canada; Conference Digest; Jun. 16, 2002; pp. 20-21.
Gassmann, F. et al; "An Isotropic Broadband Electric and Magnetic Field Sensor for Radiation Hazard Measurements"; 1993 IEEE International Symposium, Dallas, TX; Symposium Record; Aug. 9, 1993; pp. 105-109.

*Primary Examiner* — Jermele M Hollington
(74) *Attorney, Agent, or Firm* — Winstead PC

(57) ABSTRACT

Isotropic sensor 1, which comprises three sensor units 2, provided with a lead wire winding 3 surrounded by a conducting screen 4, the screen 4 being interrupted in two first zones I1, I2 diametrically opposite, there being in one of said zones I1, I2 the terminals $V_B$ for measuring the currents induced, wherein the two ends of each screen segment 41, 42 in the first two zones I1, I2 are connected two by two by means of conductors 5, 6 and comprises two second zones I3, I4 of interruption disposed at a halfway point of each screen segment 41, 42, in such a way that it is possible to measure at high frequencies simultaneously, independently and with precision, both magnetic field B and electric field E.

3 Claims, 2 Drawing Sheets

(56) References Cited

U.S. PATENT DOCUMENTS

| | | | |
|---|---|---|---|
| 4,277,744 A * | 7/1981 | Audone | G01R 29/0871 324/72 |
| 4,588,993 A * | 5/1986 | Babij | G01R 29/0878 324/72.5 |
| 5,256,960 A * | 10/1993 | Novini | G01R 33/028 324/115 |
| 5,300,885 A | 4/1994 | Bull | |
| 6,242,911 B1 * | 6/2001 | Maschek | G01R 29/0878 324/247 |
| 9,140,601 B2 * | 9/2015 | Mehendale | G01N 21/55 |
| 2006/0226826 A1 * | 10/2006 | Teppan | G01R 33/04 324/117 H |
| 2011/0140694 A1 * | 6/2011 | Cima | G01R 33/04 324/253 |

* cited by examiner

ISOTROPIC SENSOR FOR MAGNETIC AND ELECTRIC FIELDS

The present invention relates to an isotropic sensor for measuring simultaneously and with enormous precision the electric and magnetic field in places where the characteristics of these fields are unknown.

BACKGROUND OF THE INVENTION

There are different solutions for the implementation of electric and magnetic field sensors at frequencies below just a few kilohertz. These sensors cover ELF, SLF and ULF bands which range from 3 Hz to 3 kHz and which we will refer to hereinafter as low frequencies (LF). The electric field (E) sensors are based on capacitive elements such as for example parallel and flat plate capacitors. The magnetic field (B) sensors are based on windings wherein the field B induces a current by virtue of Faraday's Law. In order to make this winding immune to E field, the winding is shielded by means of a metal screen. This screen tends to have an opening or gap whose function is to prevent the circulation of currents induced by the B field in the screen.

There are some probe designs which provide for measurement of LF E and B fields simultaneously. These sensors consist of a coil with two diametrically opposite gaps wherein balancing elements (baluns) are disposed to transfer the voltages measures in the two gaps to a circuit for adding and subtracting currents whose output signals are proportional to the E and B fields.

The drawback of this design, in addition to the added complexity entailed by the baluns and the signal addition and subtraction circuit, is that its response to the B field is only noticeable at frequencies far above the LF range. This is due to the fact that the sensor consists of a single coil.

Finally, there are solutions for measuring the LF E and B fields which propose increasing the sensitivity to the B field by means of a winding with several turns shielded using a screen with two gaps.

Specifically, these are isotropic sensors of magnetic B and electric E fields, which comprise three sensor units, each sensor unit comprising a winding of lead wire surrounded by a conducting screen, the screen being interrupted in two first diametrically opposite zones in such a way that two independent screen segments are defined, there being in one of said zones the terminals for measuring the currents induced by the magnetic field in the lead wire winding and in the other zone the terminals for measuring the voltage induced in the screen by the electric field.

This shielding acts as an E field sensor in a similar way to that of the coil with two gaps described in the preceding paragraph. A sensor like this one, considered to be the closest state of the art, is shown in FIG. 1.

However, these designs do not permit simultaneous measurement of E and B as they make use of moving or mechanical parts (switches) which must be actuated by the sensor's operator. They also present the drawback of the electric sensor's immunity to B fields being very limited in field amplitude and frequency. This is due to the fact that in these sensors the B field induces a current which travels across the perimeter of the shield. This in turn produces a displacement current in the gap where it is intended to measure E, which gives rise to a voltage drop associated to the B field and not E.

DESCRIPTION OF THE INVENTION

In order to overcome the aforementioned shortcomings, the present invention proposes an isotropic magnetic and electric field sensor, which comprises three sensor units, each sensor unit comprising a lead wire winding surrounded by a conducting screen, the screen being interrupted in two first diametrically opposite zones, in such a way that two independent screen segments are defined, there being in one of said zones the terminals for measuring the currents induced by the magnetic field in the lead wire winding and in the other zones the terminals for measuring the voltage induced in the screen by the electric field, which is characterised in that the two ends of each screen segment in the two first zones are connected two by two by means of conductors and comprises two second zones of interruption disposed in a halfway point of each screen segment, in such a way that it is possible to measure simultaneously, independently and with precision, both the magnetic field on the basis of the measurement in the terminals of the winding, and the electric field on the basis of the difference in potential between the two screen segments.

The sensor of the invention allows for the simultaneous and independent measurement of variable E and B fields without using switches or moving parts. It also dispenses with the use of electronics required for adding and subtracting signals. It also helps to overcome the drawback presented by sensors wherein the shielding acts as an electric sensor.

As described in the background, this drawback consists of the immunity of the electric sensor to B fields being very limited in field amplitude and frequency, due to the fact that in the gap where E is intended to be measured, there is a voltage drop associated to the B field, and not to the E field. In the proposed design, this voltage drop is minimised thanks to the particular geometry of the shielding, which offers the currents induced by the B field a path of lower impedance (horizontal elements of the shielding) as an alternative to the gap where E is measured. Thus an electric sensor with high immunity to the B field is obtained.

According to a first alternative, the winding is rectangular or square, the first interruption zones and the second interruption zones being disposed in the middles of the sides.

According to another alternative, the winding is circular, the first interruption zones and the second interruption zones being disposed separated at 90° to each other.

BRIEF DESCRIPTION OF THE DRAWINGS

For a better understanding of that which has been described a set of drawings is attached wherein, schematically and merely by way of a non-limiting example, a practical case of embodiment is embodiment.

DESCRIPTION OF A PREFERRED EMBODIMENT

Figure 1:
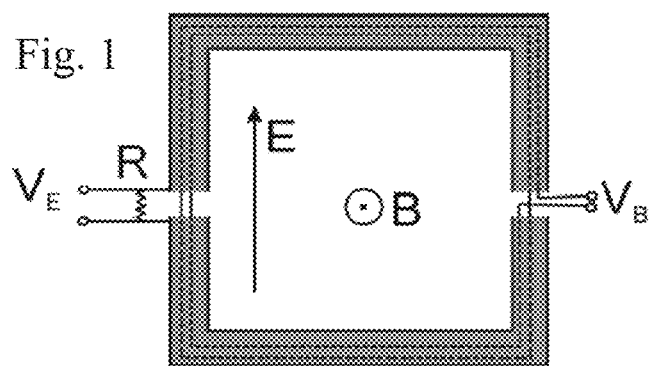
FIG. 1 is an outline of one of the sensor units of an isotropic sensor of the state of the art.

FIG. 1 shows an outline of a sensor according to the state of the art. It also shows by means of arrows the direction of the current induced by a magnetic field in the electric sensor. A conduction current travels the screen and resistance R and the circuit closes with a displacement current which travels the gap situated to the right of the screen. At low frequencies (10

Hz), the gap behaves like an opening which prevents the existence of current. However, at high frequencies (3 kHz) the capacitive impedance of the gap diminishes in such a way that it allows an observable displacement current to exist. This current, on crossing resistance R, provokes a voltage drop $V_R$ which can falsify the voltage measurement $V_E$ associated to the electric sensor.

Figure 4:
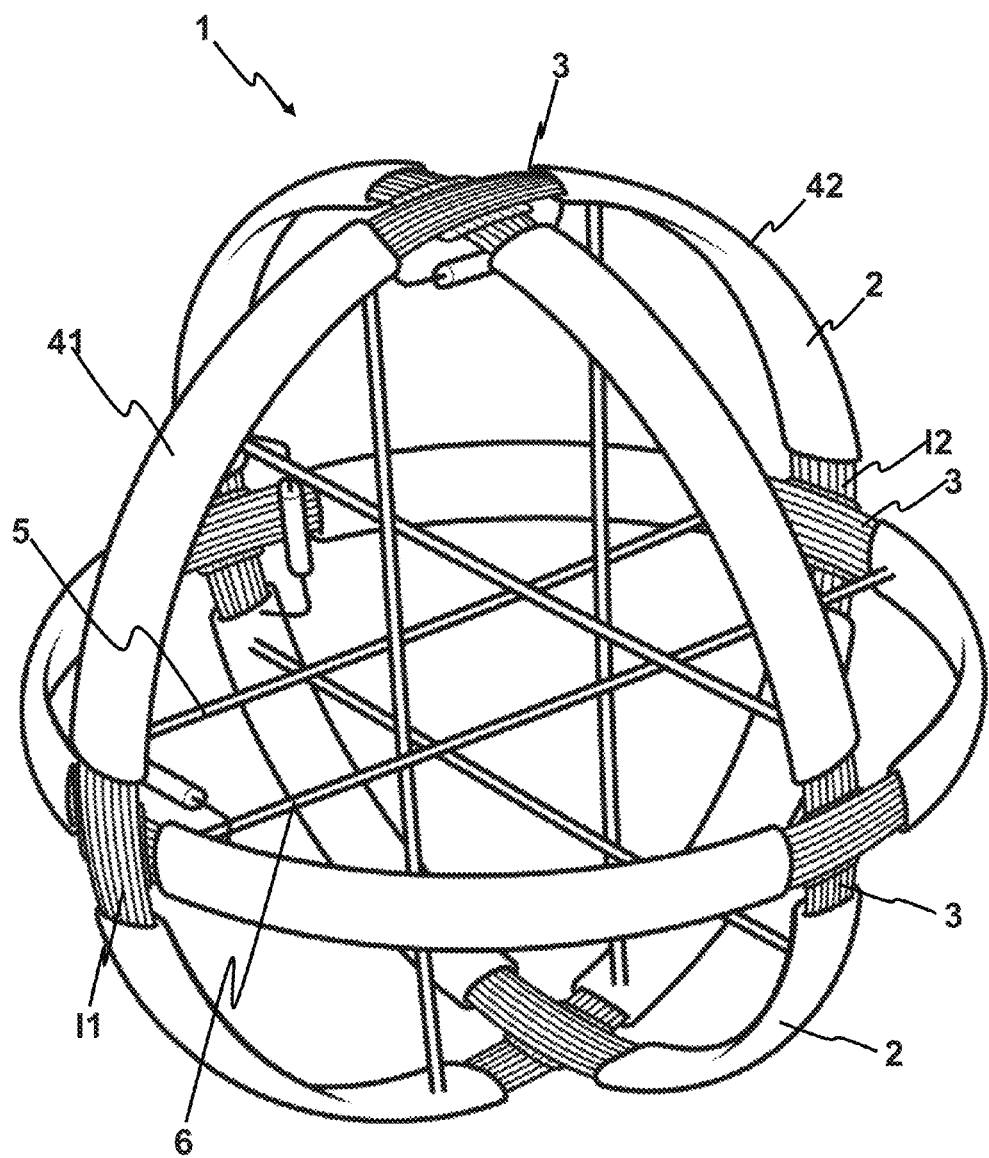
FIG. 4 is a perspective view of an isotropic sensor, wherein the relative arrangement of the three sensor units can be observed.

So as to respond to this drawback, the invention proposes, as illustrated in FIG. 4, an isotropic sensor 1 of magnetic field B and electric field E, which comprises three sensor units 2, each sensor unit 2 comprising a lead wire winding 3 surrounded by a conducting screen 4, the screen 4 being interrupted in two first zones I1, I2 diametrically opposite, in such a way that two independent screen segments 41, 42 are defined, there being in one of said zones I1, I2 the terminals $V_B$ for measuring the currents induced by the magnetic field B in the lead wire winding 3 and in the other zone I1 or I2 the terminals $V_E$ for measuring the voltage induced in the screen 4 by the electric field.

The two ends of each screen segment 41, 42 in the two first zones I1, I2 are connected two by two by means of conductors 5, 6 and comprises two second zones I3, I4 of interruption disposed at a halfway point of each one of the screen segments 41, 42, in such a way that it is possible to measure at high frequencies, simultaneously, independently and with precision, both the magnetic field B on the basis of the measurement of $V_B$ in the terminals of the winding, and the electric field E on the basis of the measurement of the difference in potential $V_E$ between the two screen segments 41, 42. According to the preferred illustrated embodiment, the winding is circular, the first zones I1, I2 of interruption and the second zones I3, I4 of interruption being disposed separated at 90° to each other.

The sensor of the invention cancels the voltage drop $V_R$ in conditions of the presence of B field only (lack of E field). The objective is to offer to the current induced by the magnetic field in the shielding, a path of much lower impedance which does not pass through resistance R. In this way, the immunity of the electric sensor to a magnetic field is drastically increased. The modification is based on short-circuiting the two ends of the resistance R by means of two conductor wires which connect to each other the two original gaps of the sensor. In this way, there is practically no current associated to the magnetic field travelling through the resistance R, meaning that the voltage drop $V_R$ is nil in conditions of the absence of E field.

Figure 2:
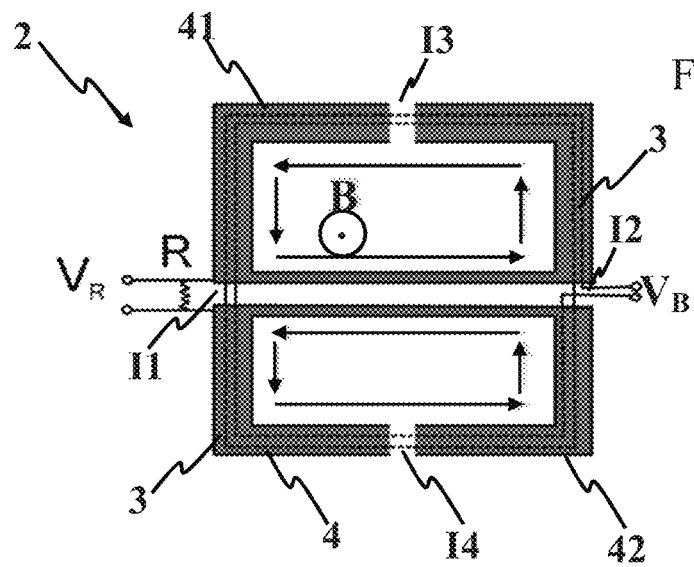
FIG. 2 is an outline of one of the sensor units of an isotropic sensor according to the invention.
Figure 3:
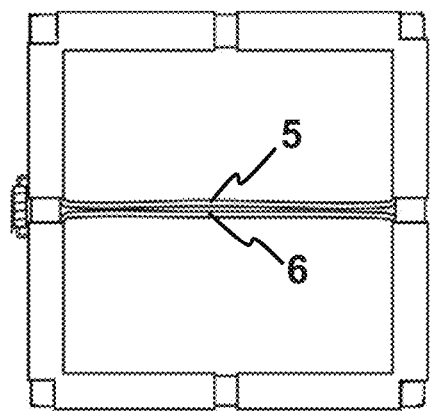
FIG. 3 is an elevation view of a prototype of a sensor unit, wherein the short-circuits between the ends of the conducting screen segments can be observed.

So that the winding which measures the magnetic field is adequately protected, it is necessary to make two new gaps I3 and I4 (situated at the top and bottom in FIG. 2), in such a way that the capacitive impedance of these new gaps reduces the current which might travel the shielding, which is necessary so that the winding is sensitive solely to the magnetic field intended to be measured and not to that originated by a significant current which might travel through the shielding.

From the point of view of the response of the electric sensor, the introduction of the pair of wires translates into the appearance of a weak capacity in parallel which is added to that of the shielding, which would increase the voltage $V_E$ although in a negligible manner. In relation to the two new gaps, their effect is to reduce the capacity of the shielding by half, which can be compensated by doubling the value of the resistance R. This continues to be acceptable as the new resistance continues to be much lower than the capacitive impedance of the shielding.

Although reference has been made to a specific embodiment of the invention, it is evident to a person skilled in the art that the isotropic sensor described is susceptible to numerous variations and modifications, and that all the mentioned details can be substituted for others which are technically equivalent, without falling outside of the scope of protection defined by the attached claims.

The invention claimed is:

1. An isotropic sensor of magnetic field and electric field, which comprises three sensor units, each sensor unit comprising:
   a lead wire winding surrounded by a conducting screen, the conducting screen being interrupted in two first zones diametrically opposite, in such a way that two independent screen segments are defined, and with each screen segment comprising two ends;
   first terminals for measuring the currents induced by the magnetic field in the lead wire winding, the first terminals being provided in one of said two first zones;
   second terminals for measuring the voltage induced in the screen by the electric field, the second terminals being provided in the other one of said two first zones;
   wherein the two ends of each screen segment in the two first zones are connected two by two by means of conductors; and
   wherein the conducting screen comprises two second zones of interruption disposed at a halfway point of each one of the screen segments in such a way that it is possible to measure at high frequencies simultaneously, independently and with precision, both the magnetic field on the basis of the measurement of the first terminals of the winding, and the electric field on the basis of the measurement of the difference in potential between the two screen segments.

2. The sensor according to claim 1, wherein the lead wire winding has a rectangular or square shape, and wherein the first zones of interruption and the second zones of interruption are arranged approximately at the midpoint of the sides of said rectangular or square shape.

3. The sensor according to claim 1, wherein the winding is circular in shape, and wherein the first zones of interruption and the second zones of interruption are arranged separated at approximately 90° to each other.

* * * * *